(12) United States Patent
Sharma

(10) Patent No.: US 11,977,402 B2
(45) Date of Patent: May 7, 2024

(54) TRANSCONDUCTORS WITH IMPROVED SLEW PERFORMANCE AND LOW QUIESCENT CURRENT

(71) Applicant: Texas Instruments Incorporated, Dallas, TX (US)

(72) Inventor: Anmol Sharma, Milpitas, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/537,358

(22) Filed: Nov. 29, 2021

(65) Prior Publication Data

US 2023/0168701 A1 Jun. 1, 2023

(51) Int. Cl.
*G05F 1/56* (2006.01)

(52) U.S. Cl.
CPC ...................... *G05F 1/56* (2013.01)

(58) Field of Classification Search
None
See application file for complete search history.

(56) References Cited

U.S. PATENT DOCUMENTS

| | | | | |
|---|---|---|---|---|
| 4,213,098 A | * | 7/1980 | Tsividis | H03F 3/45708 330/253 |
| 4,371,843 A | * | 2/1983 | Fang | H03F 3/45183 330/288 |
| 4,599,575 A | * | 7/1986 | Bernard | H03F 3/4565 330/253 |
| 4,893,092 A | * | 1/1990 | Okamoto | H03F 1/3211 330/261 |
| 5,182,525 A | * | 1/1993 | Theus | H03F 3/45076 330/253 |

(Continued)

FOREIGN PATENT DOCUMENTS

KR 1020070058750 A 6/2007

OTHER PUBLICATIONS

International Search Report dated Apr. 5, 2023.

(Continued)

*Primary Examiner* — Thomas J. Hiltunen
(74) *Attorney, Agent, or Firm* — Charles F. Koch; Frank D. Cimino

(57) ABSTRACT

A semiconductor device includes a low power fast differential transconductor, which provides an output current as a function of a difference between a reference potential input and a feedback potential input. The transconductance increases as an absolute value of the difference between the reference potential and the feedback potential increases. The transconductor includes a reference input stage to receive the reference potential and a reference load coupled in series with the reference input stage. The transconductor includes a feedback input stage to receive the feedback potential and a feedback load coupled in series with the feedback input stage. The transconductor further includes a current limiting component that is configured to control a total current through the reference input stage and the feedback input stage. The transconductor includes a negative feedback path from the reference load to the current limiting component, that compensates for changes in the total current due to differences between the reference potential and the feedback potential.

20 Claims, 8 Drawing Sheets

(56) References Cited

U.S. PATENT DOCUMENTS

| | | | | |
|---|---|---|---|---|
| 5,874,830 | A * | 2/1999 | Baker | G05F 3/247 |
| | | | | 365/189.09 |
| 6,333,623 | B1 * | 12/2001 | Heisley | G05F 1/575 |
| | | | | 323/280 |
| 6,642,791 | B1 * | 11/2003 | Balan | H03F 3/45183 |
| | | | | 330/253 |
| 7,023,276 | B2 * | 4/2006 | Vollrath | H03F 3/45183 |
| | | | | 330/261 |
| 7,982,448 | B1 * | 7/2011 | Prasad | G05F 1/575 |
| | | | | 323/311 |
| 8,237,502 | B2 * | 8/2012 | Yuasa | H03F 3/45183 |
| | | | | 330/259 |
| 8,400,218 | B2 * | 3/2013 | Lee | H03F 3/24 |
| | | | | 330/261 |
| 9,300,257 | B1 * | 3/2016 | Kulkarni | H03F 3/45183 |
| 9,595,975 | B1 * | 3/2017 | Song | H03M 1/12 |
| 9,904,310 | B2 * | 2/2018 | Ihm | G05F 3/262 |
| 10,281,940 | B2 * | 5/2019 | Yang | G05F 1/575 |
| 10,496,118 | B2 * | 12/2019 | Sakaguchi | G05F 1/575 |
| 11,340,643 | B2 * | 5/2022 | Hu | H03F 3/45269 |
| 2008/0136523 | A1 | 6/2008 | Chiu | |
| 2019/0372537 | A1 | 12/2019 | Binet | |
| 2023/0361735 | A1 * | 11/2023 | Nakajima | H03F 3/45192 |

OTHER PUBLICATIONS

Huang Bin, et al: "A Simple Slew Rate Enhancement Technique with Improved Linearity and Preserved Small Signal Performance," 2013 IEEE 56th International Midwest Symposium on Circuits and Systems (MWSCAS), IEEE, Aug. 3, 2014 (Aug. 3, 2014), pp. 270-273, XP032648922, ISSN: 1548-3746, DOI:10.1109/MWSCAS. 2014.6908404, ISBN: 978-1-4799-4134-6.
KR1020070058780A, machine translation.

\* cited by examiner

TRANSCONDUCTORS WITH IMPROVED SLEW PERFORMANCE AND LOW QUIESCENT CURRENT

TECHNICAL FIELD

This description relates to the field of semiconductor devices. More particularly, but not exclusively, this description relates to transconductors in semiconductor devices.

BACKGROUND

A differential transconductor provides an output current that is an approximately linear function of a difference between two voltage inputs. Differential transconductors are used in voltage regulators, filters, and amplifiers, for example. Two important performance parameters of a differential transconductor are slew rate and quiescent current. Slew rate is a measure of the output current when the two voltage inputs are different. Quiescent current is a measure of the current consumed by the differential transconductor when the two voltage inputs are equal.

SUMMARY

The description describes a semiconductor device including a low power fast differential transconductor, referred to herein as the transconductor. The transconductor includes a reference input stage configured to receive a reference potential and a reference load coupled in series with the reference input stage. The transconductor includes a feedback input stage configured to receive a feedback potential and a feedback load coupled in series with the feedback input stage. The transconductor further includes a current limiting component that is configured to control a total current through the reference input stage and the feedback input stage. The transconductor includes an output current terminal configured to provide an output current that is a function of a difference between the reference potential and the feedback potential. The transconductor includes a negative feedback path from the reference load to the current limiting component, configured to compensate for changes in the total current when the reference potential is different from the feedback potential. The transconductance, that is, the ratio of a change in the output current at the output current terminal to a change in the difference between the reference potential and the feedback potential, increases as an absolute value of the difference between the reference potential and the feedback potential increases.

DETAILED DESCRIPTION

Figure 1:
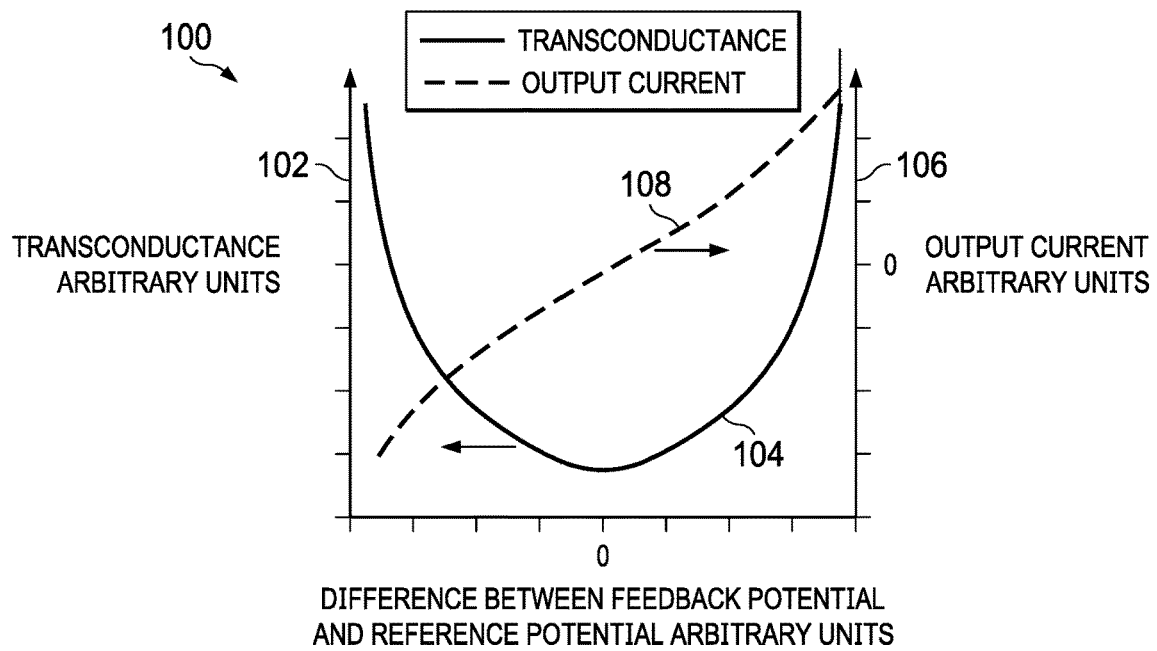
FIG. 1 is a chart depicting transconductance and output current versus the difference between the reference potential and the feedback potential for an example transconductor, according to an embodiment of this description.

The drawings are not necessarily drawn to scale. This description is not limited by the illustrated ordering of acts or events, as some acts or events may occur in different orders and/or concurrently with other acts or events. Furthermore, some illustrated acts or events are optional.

Although some embodiments illustrated herein are shown in two-dimensional views with various regions having depth and width, those regions may illustrate a portion of a device that is actually a three-dimensional structure. Accordingly, those regions have three dimensions, including length, width and depth, when fabricated on an actual device.

The transconductor includes a reference input stage configured to receive a reference potential and a feedback input stage configured to receive a feedback potential. A current limiting component controls a total current through the reference input stage and the feedback input stage. A reference load is coupled in series with the reference input stage, and a feedback load is coupled in series with the feedback input stage. An output current node is configured to provide the output current. The increasing transconductance is achieved by a negative feedback path from the reference load to the current limiting component, configured to compensate for changes in the total current when the reference potential is different from the feedback potential. Having the current limiting component in series with the reference input stage and the feedback input stage results in the transconductor drawing less power when the feedback potential equals the reference potential, which may advantageously reduce a quiescent current of the semiconductor device compared to semiconductor devices having transconductors with positive feedback loops. A further advantage of this transconductor is slew current, that is, the output current when the feedback potential is different from the reference potential, is not present when the feedback potential equals the reference potential, which may further reduce the quiescent current.

In some embodiments, the transconductor may provide a sunk output functionality, that is, the output current is controlled by controlling an output driver connected between the output node and a ground terminal of the semiconductor device. In some embodiments, the transconductor may provide a sourced output functionality, that is, the output current is controlled by controlling an output driver connected between the output node and a power terminal of the semiconductor device. In some embodiments, the transconductor may provide a bidirectional output functionality, that is, the output current is controlled by controlling an output driver connected between the output node and a power terminal of the semiconductor device, and by controlling another output driver connected between the output node and a ground terminal of the semiconductor device. In some embodiments, the transconductor may provide a complementary polarity of the output current, that is, the output current decreases when the difference between the reference potential and the feedback potential increases, and vice versa. The difference between the reference potential and the feedback potential is defined for the purpose of this description as the reference potential minus the feedback potential. In some embodiments, the transconductor may provide a non-complementary polarity of the output current, that is, the output current increases when the difference between the reference potential and the feedback potential increases, and vice versa.

For the purposes of this description, it will be understood that, if a component is described as being "connected" or "coupled" to another component, it may be directly connected or directly coupled to the other element, or intervening components may be present. In either case, components that are coupled or connected together are capable of direct current (DC) electrical conductivity between the coupled or connected components. If a component is referred to as being "directly coupled" or "directly connected" to another component, it is understood there are no other intentionally disposed intervening components present, with the possible exception of electrical conductors such as metal interconnects of the semiconductor device. Components which are not capable of DC electrical conductivity between them, but may be affected by mutual inductive or capacitive effects, are not considered to be coupled or connected unless specifically described to be so.

Operational characteristics, such as current flow, of various components of the transconductor are described herein. It is understood that described operational characteristics of the components occur during operation of the semiconductor device, and are not expected to be manifested when the semiconductor device is not operated.

FIG. 1 is a chart depicting transconductance and output current versus a difference between a reference potential and a feedback potential for an example transconductor, according to an embodiment of this description. In the chart 100, the horizontal axis is the difference between the reference potential and the feedback potential. The difference between the reference potential and the feedback potential may be expressed in millivolts, by way of example. The left vertical axis 102 is the transconductance. The transconductance may be expressed in units of siemens, that is, amps per volt, by way of example. In some cases, the transconductance may be expressed in units of millisiemens; in other cases, the transconductance may be expressed in units of microsiemens. The transconductance curve 104 has a minimum at a value of approximately 0 millivolts for the difference between the reference potential and the feedback potential, within 5 millivolts. The transconductance curve 104 is concave upward for both positive and negative values of the difference between the reference potential and the feedback potential, which advantageously provides more current to reduce recovery time for a circuit coupled to the transconductor, compared to a transconductor having a flat or downward-curving transconductance curve. In this example, all the transconductance values are positive.

The right vertical axis 106 is the output current. The output current may be expressed in units of microamperes in some case, or milliamperes in other cases, by way of example. In this example, the output current curve 108 is concave upward for positive values of the difference between the reference potential and the feedback potential, and is concave downward for negative values of the difference, consistent with the transconductance values all being positive.

Figure 2:
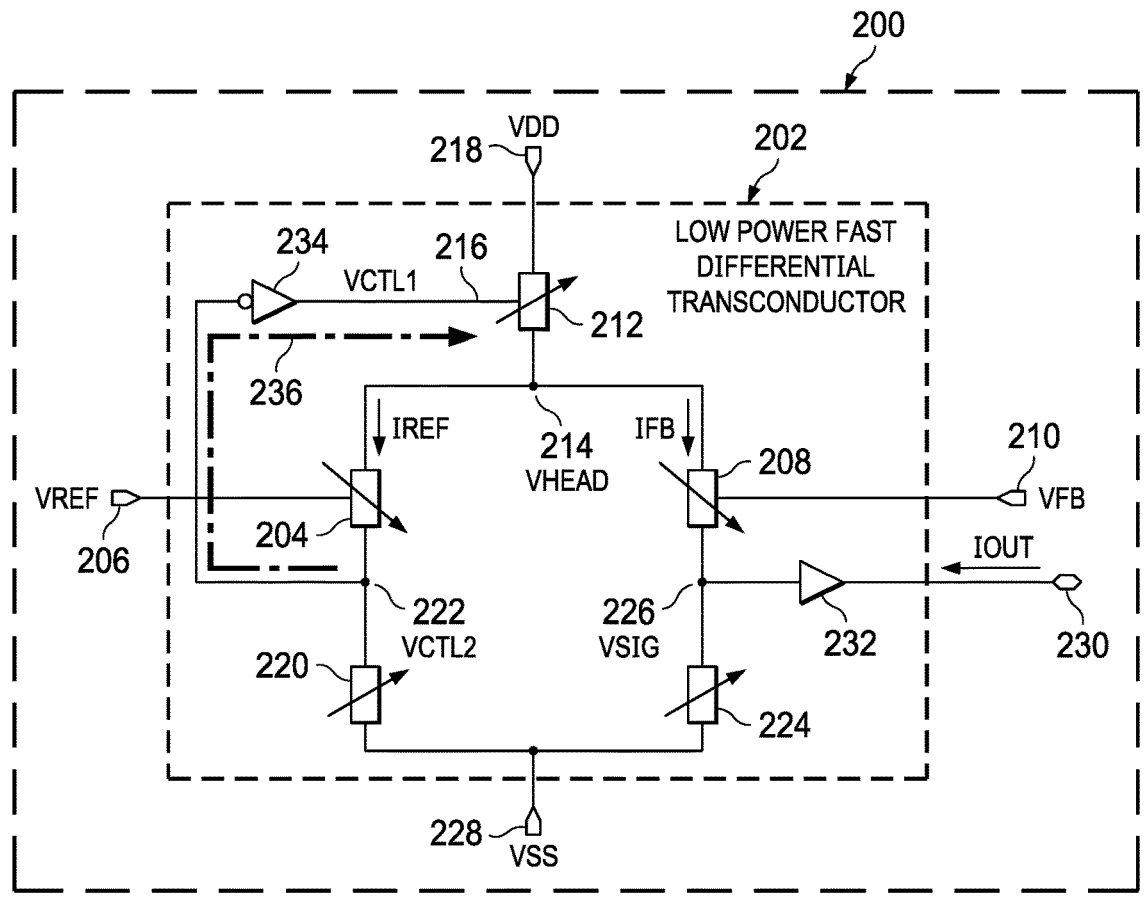
FIG. 2 is a conceptual schematic of a semiconductor device that includes an example transconductor, according to an embodiment of this description.

FIG. 2 is a conceptual schematic of a semiconductor device that includes an example transconductor, according to an embodiment of this description. The semiconductor device 200 may be implemented as a voltage regulator, a high speed amplifier, or a filter, by way of example. The transconductor 202 includes a reference input stage 204 configured to receive a reference potential, labeled "VREF" in FIG. 2, at a reference input port 206. The transconductor 202 includes a feedback input stage 208 configured to receive a feedback potential, labeled "VFB" in FIG. 2, at a feedback input port 210. In this example, the reference input stage 204 has negative transconductance, that is, increasing the reference potential VREF reduces current through the reference input stage 204, and vice versa. Similarly, the feedback input stage 208 has negative transconductance, that is, increasing the feedback potential VFB reduces current through the feedback input stage 208, and vice versa.

The transconductor 202 includes a current limiting component 212 coupled in series with the reference input stage 204 and the feedback input stage 208, at a branch node 214. The reference input stage 204 and the feedback input stage 208 are in parallel current paths, as shown in FIG. 2. The current limiting component 212 has a current control node 216. Current through the current limiting component 212 is regulated by a first control potential, labeled "VCTL1" in FIG. 2, on the current control node 216, during operation of the semiconductor device 200. The current limiting component 212 of this example has a positive transconductance, that is, increasing the first control potential VCTL1 on the current control node 216 increases current through the current limiting component 212, and vice versa. The current limiting component 212 is coupled to a power terminal 218 opposite from the connections to the reference input stage 204 and the feedback input stage 208. The power terminal 218 is configured to provide current at a positive power potential, labeled "VDD" in FIG. 2, to the transconductor 202, so that the current flows from the power terminal 218 through the current limiting component 212 to the reference input stage 204 and the feedback input stage 208. The current through the current limiting component 212 is divided between a reference current, labeled "IREF" in FIG. 2, through the reference input stage 204, and a feedback current, labeled "IFB" in FIG. 2, through the feedback input stage 208.

The transconductor 202 includes a reference load 220 connected through a control signal node 222 to the reference input stage 204. The reference current IREF flows through the reference input stage 204, the control signal node 222, and the reference load 220. The reference load 220 may have an impedance that varies as a function of the reference current IREF through the reference load 220, as indicated schematically in FIG. 2, so that a second control potential, labeled "VCTL2" in FIG. 2, at the control signal node 222 is a function of the reference current IREF.

The transconductor 202 includes a feedback load 224 connected through an output signal node 226 to the feedback input stage 208. The feedback current IFB through the feedback input stage 208 flows through the output signal node 226 and the feedback load 224. The feedback load 224 may have an impedance that varies as a function of the feedback current IFB through the feedback load 224, as indicated schematically in FIG. 2, so that an output signal potential, labeled "VSIG" in FIG. 2, at the control signal node 222 is a function of the feedback current IFB.

The reference load 220 and the feedback load 224 are connected to a ground terminal 228 opposite from the connections to the reference input stage 204 and the feedback input stage 208, respectively. The ground terminal 228 is configured to receive current at a ground potential, labeled "VSS" in FIG. 2. The reference current IREF and the feedback current IFB flow to the ground terminal 228.

The transconductor 202 includes an output current terminal 230 coupled to the output signal node 226 through an output buffer 232. The output buffer 232 converts the output signal potential VSIG at the output signal node 226 to an output current, labeled "IOUT" in FIG. 2, which flows through the output current terminal 230.

The control signal node 222 is coupled to the current control node 216 of the current limiting component 212 through an inverting control buffer 234, as indicated in FIG. 2, so that the first control potential VCTL1 has a negative correlation to the second control potential VCTL2. Coupling the control signal node 222 to the current control node 216 through the inverting control buffer 234 provides a negative feedback path 236 that compensates for variations in a head potential, labeled "VHEAD" in FIG. 2, at the branch node 214 when the feedback current IFB changes due to variations in the feedback potential VFB. During operation of the semiconductor device 200, when the feedback potential VFB decreases, an impedance of the feedback input stage 208 decreases and the feedback current IFB increases due to the negative transconductance of the feedback input stage 208, causing the output signal potential VSIG to increase, causing the output current IOUT to increase. The head potential VHEAD decreases because the impedance of the feedback input stage 208 decreases, causing the reference current VREF to decrease, causing the second control potential VCTL2 to decrease. The inverting control buffer 234 increases the first control potential VCTL1 which reduces an impedance of the current limiting component 212, thereby further increasing the feedback current IFB and further increasing the output current IOUT, which increases the transconductance of the transconductor 202. Conversely, when the feedback potential VFB increases, an impedance of the feedback input stage 208 increases and the feedback current IFB decreases, causing the output signal potential VSIG to decrease, causing the output current IOUT to decrease. The second control potential VCTL2 increases, and the inverting control buffer 234 decreases the first control potential VCTL1 which increases the impedance of the current limiting component 212, thereby further decreasing the feedback current IFB and further decreasing the output current IOUT, which increases the transconductance of the transconductor 202. Thus, the negative feedback path 236 provides an increased transconductance of the transconductor 202 when feedback potential VFB differs from the reference potential VREF.

Figure 3:
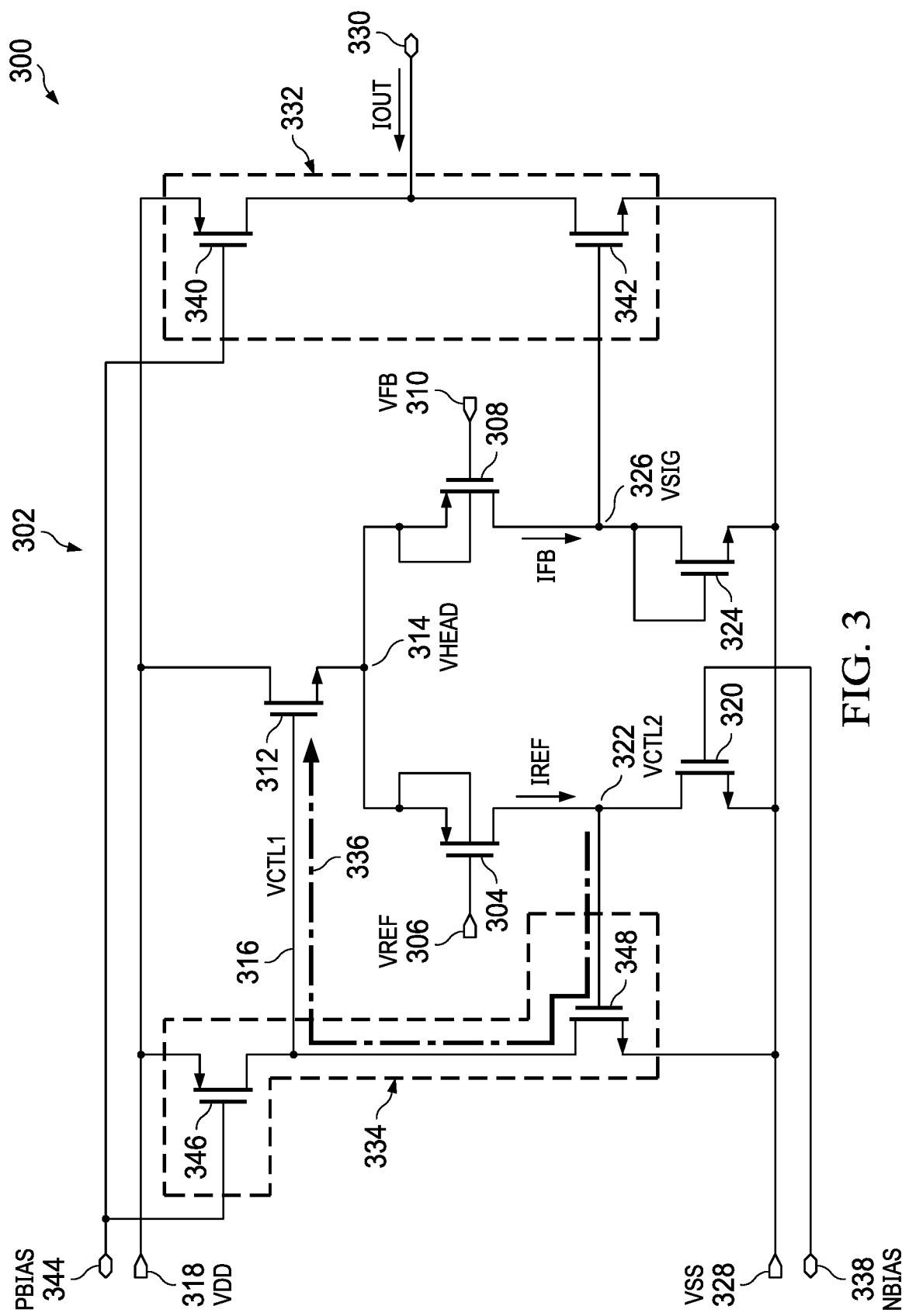
FIG. 3 is a circuit schematic of an example transconductor, according to an embodiment of this description.

FIG. 3 is a circuit schematic of an example transconductor, according to an embodiment of this description. The transconductor 302 includes a reference input stage 304 configured to receive a reference potential, labeled "VREF" in FIG. 3, at a reference input port 306. The transconductor 302 includes a feedback input stage 308 configured to receive a feedback potential, labeled "VFB" in FIG. 3, at a feedback input port 310. In this example, the reference input stage 304 and the feedback input stage 308 may be implemented as p-channel field effect transistors (PFETs), which have negative transconductances.

The transconductor 302 includes a current limiting component 312 coupled in series with the reference input stage 304 and with the feedback input stage 308, in parallel current paths, as shown in FIG. 3, at a branch node 314. In this example, the current limiting component 312 may be implemented as an n-channel field effect transistor (NFET), which has a positive transconductance. The current limiting component 312 has a current control node 316, which has a first control potential, labeled "VCTL1" in FIG. 3, during operation of the transconductor 302. The current limiting component 312 is coupled to a power terminal 318 that is configured to provide current at a positive power potential, labeled "VDD" in FIG. 3, to the transconductor 302. The current flows from the power terminal 318 through the current limiting component 312 and divides into a reference current, labeled "IREF" in FIG. 3, through the reference input stage 304, and a feedback current, labeled "IFB" in FIG. 3, through the feedback input stage 308.

The transconductor 302 includes a feedback load 324 connected through an output signal node 326 to the feedback input stage 308. In this example, the feedback load 324 may be implemented as an NFET configured as an NMOS diode, in which a gate of the NMOS diode is directly connected to a drain of the NMOS diode, as indicated in FIG. 3. An output signal potential, labeled "VSIG" in FIG. 3, at the output signal node 326 is equal to a voltage drop across the feedback load 324 due to the feedback current IFB.

The transconductor 302 includes a reference load 320 connected through a control signal node 322 to the reference input stage 304. In this example, the reference load 320 may be implemented as an NFET. A gate of the reference load 320 may be connected to an NMOS bias terminal 338 that is configured to provide an NMOS bias potential, labeled "NBIAS" in FIG. 3, to the gate of the reference load 320. The NMOS bias potential NBIAS may be above a threshold potential of the reference load 320, but significantly below a saturation potential, so that the reference load 320 is operating in a linear mode. A second control potential, labeled "VCTL2" in FIG. 3, at the control signal node 322 is equal to a voltage drop across the reference load 320 due to the reference current IREF.

The reference load 320 and the feedback load 324 are connected to a ground terminal 328 which is configured to receive current at a ground potential, labeled "VSS" in FIG. 3. The reference current IREF and the feedback current IFB flow to the ground terminal 328.

The transconductor 302 includes an output current terminal 330 coupled to the output signal node 326 through an output buffer 332. The output buffer 332 converts the output signal potential VSIG at the output signal node 326 to an output current, labeled "IOUT" in FIG. 3, which flows through the output current terminal 330. In this example, the output buffer 332 includes an output load 340, implemented as a PFET in this example, and an output driver 342, implemented as an NFET in this example, coupled in series, with the output signal node 326 connected to a drain of the output load 340 and to a drain of the output driver 342. A gate of the output load 340 is connected to a PMOS bias terminal 344 that is configured to provide a PMOS bias potential, labeled "PBIAS" in FIG. 3, to the gate of the output load 340. The PMOS bias potential PBIAS may be below a threshold potential of the output load 340, but significantly above a saturation potential, so that the output load 340 is operating in a linear mode. A gate of the output driver 342 is connected to the output signal node 326. A source of the output load 340 is connected to the power terminal 318. A source of the output driver 342 is connected to the ground terminal 328. The output buffer 332 of this example provides a sunk output functionality having a complementary polarity for the output current IOUT.

The control signal node 322 is coupled to the current control node 316 of the current limiting component 312 through an inverting control buffer 334, as indicated in FIG. 3, so that the first control potential VCTL1 has a negative correlation to the second control potential VCTL2. In this example, the inverting control buffer 334 includes a control load 346, implemented as a PFET in this example, and a control driver 348, implemented as an NFET in this example, coupled in series, with the control signal node 322 connected to a drain of the control load 346 and to a drain of the control driver 348. A gate of the control load 346 is connected to the PMOS bias terminal 344. A gate of the control driver 348 is connected to the control signal node 322. A source of the control load 346 is connected to the power terminal 318. A source of the control driver 348 is connected to the ground terminal 328. Coupling the control signal node 322 to the current control node 316 through the inverting control buffer 334 provides a negative feedback path 336 that reduces variations in a head potential, labeled "VHEAD" in FIG. 3, at the branch node 314 when the feedback current IFB changes due to variations in the feedback potential VFB.

Operation of the transconductor 302 proceeds as described for the transconductor 202 of FIG. 2. The transconductor 302 may provide a desired increase in the transconductance as an absolute value of a difference between the feedback potential VFB and the reference potential VREF increases. Furthermore, the transconductor 302 of this example may have a smaller area compared to a more complicated transconductor, due to implementation of the negative feedback path 336, advantageously enabling a smaller area for a semiconductor device 300 containing the transconductor 302.

Figure 4:
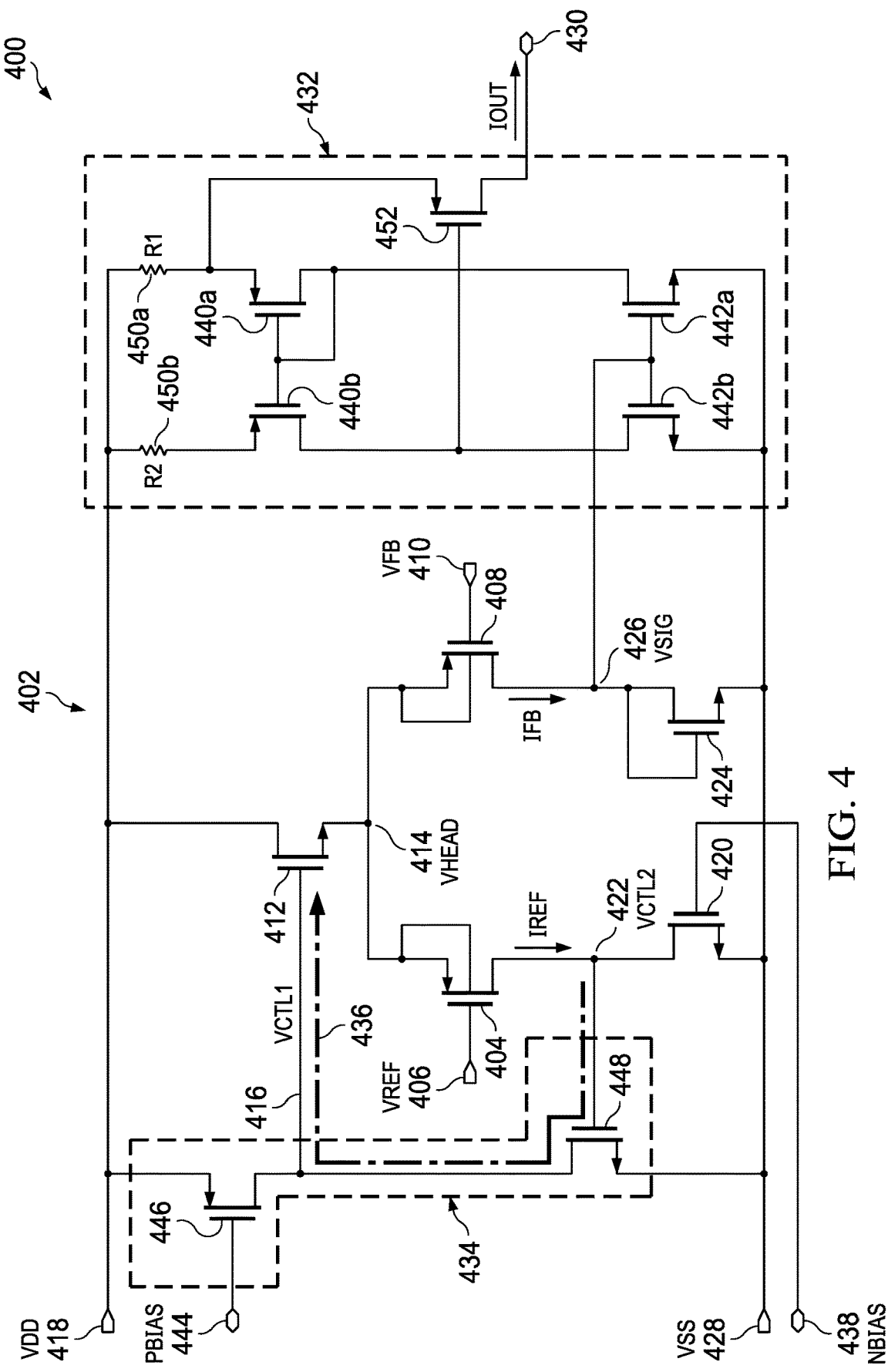
FIG. 4 is a circuit schematic of another example transconductor, according to an embodiment of this description.

FIG. 4 is a circuit schematic of another example transconductor, according to an embodiment of this description. The transconductor 402 includes a reference input stage 404 configured to receive a reference potential, labeled "VREF" in FIG. 4, at a reference input port 406. The transconductor 402 includes a feedback input stage 408 configured to receive a feedback potential, labeled "VFB" in FIG. 4, at a feedback input port 410. In this example, the reference input stage 404 and the feedback input stage 408 may be implemented as PFETs, as indicated in FIG. 4.

The transconductor 402 includes a current limiting component 412, implemented as an NFET in this example, as indicated in FIG. 4, coupled in series with the reference input stage 404 and with the feedback input stage 408 at a branch node 414. The current limiting component 412 has a current control node 416, which has a first control potential, labeled "VCTL1" in FIG. 4, during operation of the transconductor 402. The current limiting component 412 is coupled to a power terminal 418 that is configured to provide current at a positive power potential, labeled "VDD" in FIG. 4, to the transconductor 402.

The transconductor 402 includes a feedback load 424, implemented as an NMOS diode in this example, connected through an output signal node 426 to the feedback input stage 408. An output signal potential, labeled "VSIG" in FIG. 4, at the output signal node 426 is equal to a voltage drop across the feedback load 424 due to the feedback current IFB.

The transconductor 402 includes a reference load 420, implemented as an NFET in this example, connected through a control signal node 422 to the reference input stage 404. A gate of the reference load 420 may be connected to an NMOS bias terminal 438. A second control potential, labeled "VCTL2" in FIG. 4, at the control signal node 422 is equal to a voltage drop across the reference load 420 due to the reference current IREF. The reference load 420 and the feedback load 424 are connected to a ground terminal 428 which is configured to receive current at a ground potential, labeled "VSS" in FIG. 4.

During operation of a semiconductor device 400 containing the transconductor 402, the current flows from the power terminal 418 through the current limiting component 412 and divides into a reference current, labeled "IREF" in FIG. 4, through the reference input stage 404, and a feedback current, labeled "IFB" in FIG. 4, through the feedback input stage 408, at the branch node 414. The reference current IREF flows through the control signal node 422 and the reference load 420 to the ground terminal 428. The feedback current IFB flows through the output signal node 426 and the feedback load 424 to the ground terminal 428.

The control signal node 422 is coupled to the current control node 416 of the current limiting component 412 through an inverting control buffer 434, as indicated in FIG. 4, so that the first control potential VCTL1 has a negative correlation to the second control potential VCTL2. In this example, the inverting control buffer 434 includes a control load 446, implemented as a PFET in this example, and a control driver 448, implemented as an NFET in this example, coupled in series, with the control signal node 422 connected to a drain of the control load 446 and to a drain of the control driver 448. A gate of the control load 446 is connected to a PMOS bias terminal 444. A gate of the control driver 448 is connected to the control signal node 422. A source of the control load 446 is connected to the power terminal 418. A source of the control driver 448 is connected to the ground terminal 428. Coupling the control signal node 422 to the current control node 416 through the inverting control buffer 434 provides a negative feedback path 436 that reduces variations in a head potential, labeled "VHEAD" in FIG. 4, at the branch node 414 when the feedback current IFB changes due to variations in the feedback potential VFB.

The transconductor 402 includes an output current terminal 430 coupled to the output signal node 426 through an output buffer 432. The output buffer 432 converts the output signal potential VSIG at the output signal node 426 to an output current, labeled "IOUT" in FIG. 4, which flows through the output current terminal 430. In this example, the output buffer 432 includes two parallel current paths to provide an amplified transconductance.

A first current path of the output buffer 432 includes a first resistor 450a, labeled "R1" in FIG. 4, a first output load 440a, implemented as a PFET in this example, and a first output driver 442a, implemented as an NFET in this example, coupled in series. A first terminal of the first resistor 450a is connected to the power terminal 418. A source of the first output load 440a is connected to a second terminal of the first resistor R1 450a. A source of the first output driver 442a is connected to the ground terminal 428.

A second current path of the output buffer 432 includes a second resistor 450b, labeled "R2" in FIG. 4, a second output load 440b, implemented as a PFET in this example, and a second output driver 442b, implemented as an NFET in this example, coupled in series. A first terminal of the second resistor 450b is connected to the power terminal 418. A source of the second output load 440b is connected to a second terminal of the second resistor R2 450b. A source of the second output driver 442b is connected to the ground terminal 428.

Gates of the first output load 440a and the second output load 440b are connected to a drain of the first output load 440a; the first output load 440a thus operates as a PMOS diode. Gates of the first output driver 442a and the second output driver 442b are connected to the output signal node 426. The first resistor R1 450a, the second resistor R2 450b, the first output load 440a, the second output load 440b, the first output driver 442a, and the second output driver 442b provide an amplifier of the output buffer 432, configured to provide the amplified transconductance.

The output buffer 432 includes an output stage 452, implemented as a PMOS source follower in this example. A source of the output stage 452 is connected to the source of the first output load 440a. A gate of the output stage 452 is connected to a drain of the second output driver 442b. A drain of the output stage 452 is connected to the output current terminal 430.

Operation of the transconductor 402 is similar to operation of the transconductor 302 of FIG. 3, up to generation of the output signal potential VSIG at the output signal node 326 of FIG. 3. The output buffer 432 amplifies the output signal potential VSIG at the output signal node 426 by a factor approximately equal to a ratio of a resistance of the second resistor 450b to a resistance of the first resistor 450a. Thus, an intrinsic transconductance of the reference input stage 404, the feedback input stage 408, the reference load 420, and the feedback load 424, is amplified by the factor approximately equal to a ratio of a resistance of the second resistor 450b to a resistance of the first resistor 450a, enabling the transconductor 402 to drive a larger load at the output signal node 426. A quiescent current of the transconductor 402 is lower than comparable transconductors with equivalent values of transconductance, due to the transconductor 402 drawing no slew current when the feedback potential VFB equals the reference potential VREF.

The output buffer 432 of this example provides a sourced output functionality having a complementary polarity for the output current IOUT. The sourced output functionality may be advantageous for grounded loads connected to the output signal node 326. The transconductor 402, having amplified transconductance, may be especially advantageous for driving capacitors that are external to the semiconductor device 400 containing the transconductor 402.

Figure 5:
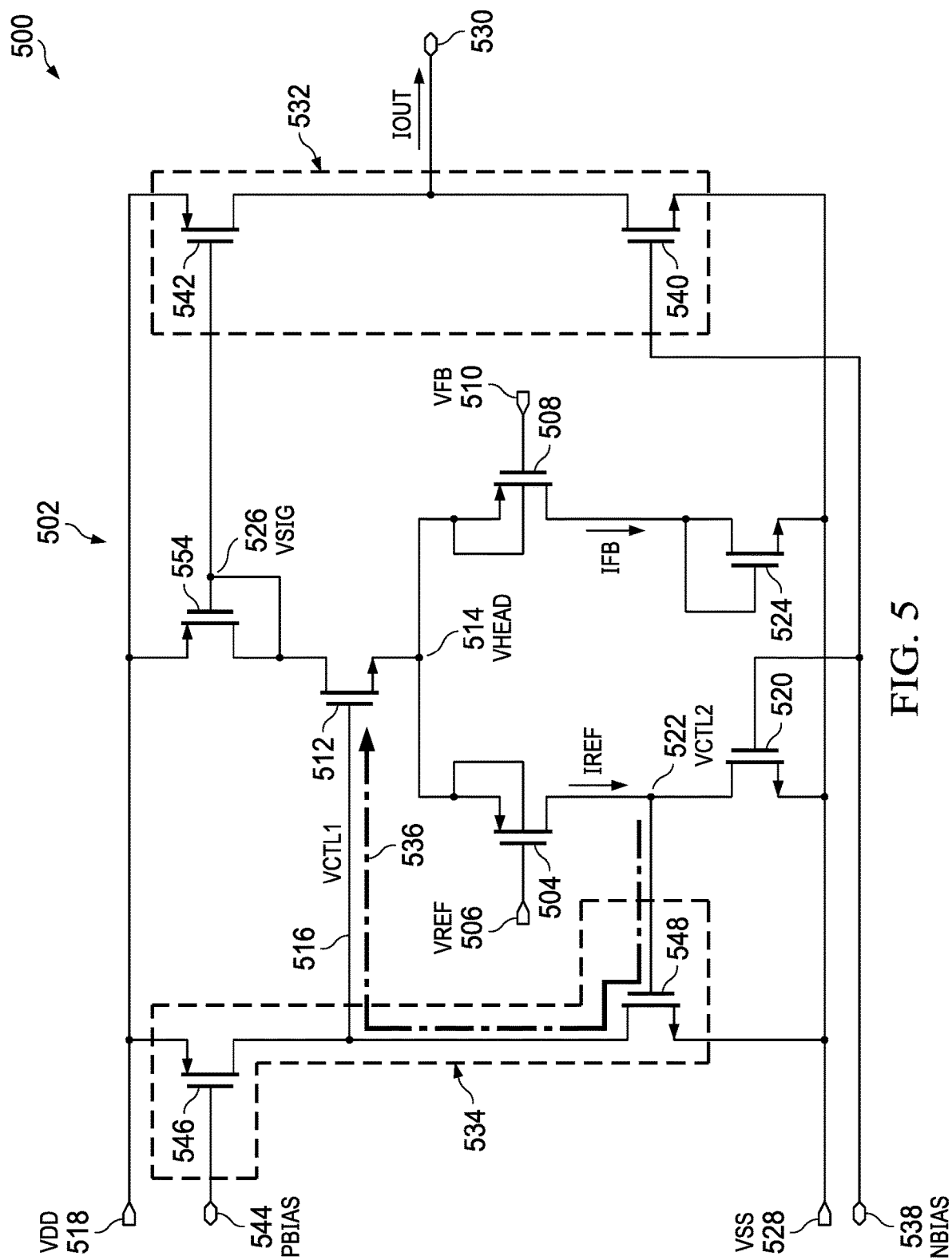
FIG. 5 is a circuit schematic of another example transconductor, according to an embodiment of this description.

FIG. 5 is a circuit schematic of another example transconductor, according to an embodiment of this description. The transconductor 502 includes a reference input stage 504 configured to receive a reference potential, labeled "VREF" in FIG. 5, at a reference input port 506. The transconductor 502 includes a feedback input stage 508 configured to receive a feedback potential, labeled "VFB" in FIG. 5, at a feedback input port 510. In this example, the reference input stage 504 and the feedback input stage 508 may be implemented as PFETs, as indicated in FIG. 5.

The transconductor 502 includes a current limiting component 512, implemented as an NFET in this example, as indicated in FIG. 5, coupled in series with the reference input stage 504 and with the feedback input stage 508 at a branch node 514. The current limiting component 512 has a current control node 516, which has a first control potential, labeled "VCTL1" in FIG. 5, during operation of the transconductor 502.

The transconductor 502 of this example includes a current sensor 554 coupled in series with the current limiting component 512. In this example, the current sensor 554 is implemented as a PFET. A drain of the current sensor 554 is connected to a gate of the current sensor 554 and to a drain of the current limiting component 512. A source of the current sensor 554 connected to a power terminal 518 that is configured to provide current at a positive power potential, labeled "VDD" in FIG. 5, to the transconductor 502. The current sensor 554 of this example is thus configured as a PMOS diode. In this example, the gate of the current sensor 554 provides an output signal node 526, which has an output signal potential, labeled "VSIG" in FIG. 5, during operation of the transconductor 502.

The transconductor 502 includes a reference load 520, implemented as an NFET in this example, connected through a control signal node 522 to the reference input stage 504. A gate of the reference load 520 may be connected to an NMOS bias terminal 538.

The transconductor 502 includes a feedback load 524, implemented as an NMOS diode in this example. A drain of the feedback load 524 is connected to the feedback input stage 508. The reference load 520 and the feedback load 524 are connected to a ground terminal 528 which is configured to receive current at a ground potential, labeled "VSS" in FIG. 5.

The current flows from the power terminal 518 through the current sensor 554, through the current limiting component 512 and divides into a reference current, labeled "IREF" in FIG. 5, through the reference input stage 504, and a feedback current, labeled "IFB" in FIG. 5, through the feedback input stage 508, at the branch node 514. The reference current IREF flows through the control signal node 522 and the reference load 520 to the ground terminal 528. A second control potential, labeled "VCTL2" in FIG. 5, at the control signal node 522 is equal to a voltage drop across the reference load 520 due to the reference current IREF. The feedback current IFB flows through the feedback load 524 to the ground terminal 528.

The control signal node 522 is coupled to the current control node 516 of the current limiting component 512 through an inverting control buffer 534, as indicated in FIG. 5, so that the first control potential VCTL1 has a negative correlation to the second control potential VCTL2. In this example, the inverting control buffer 534 includes a control load 546, implemented as a PFET in this example, and a control driver 548, implemented as an NFET in this example, coupled in series, with the control signal node 522 connected to a drain of the control load 546 and to a drain of the control driver 548. A gate of the control load 546 is connected to the PMOS bias terminal 544. A gate of the control driver 548 is connected to the control signal node 522. A source of the control load 546 is connected to the power terminal 518. A source of the control driver 548 is connected to the ground terminal 528. Coupling the control signal node 522 to the current control node 516 through the inverting control buffer 534 provides a negative feedback path 536 that reduces variations in a head potential, labeled "VHEAD" in FIG. 5, at the branch node 514 when the feedback current IFB changes due to variations in the feedback potential VFB.

The transconductor 502 includes an output current terminal 530 coupled to the output signal node 526 through an output buffer 532. The output buffer 532 converts the output signal potential VSIG at the output signal node 526 to an output current, labeled "IOUT" in FIG. 5, which flows through the output current terminal 530. In this example, the output buffer 532 includes an output load 540, implemented as an NFET in this example, and an output driver 542, implemented as a PFET in this example, coupled in series, with the output signal node 526 connected to a drain of the output load 540 and to a drain of the output driver 542. A gate of the output load 540 is connected to an NMOS bias terminal 538 A gate of the output driver 542 is connected to the output signal node 526. A source of the output load 540 is connected to the ground terminal 528. A source of the output driver 542 is connected to the power terminal 518. The output buffer 532 of this example provides a sourced output functionality having a complementary polarity for the output current IOUT. Operation of the transconductor 502 is similar to operation of the transconductor 302 of FIG. 3, with the current sensor 554 providing the output signal potential VSIG to enable the sourced output functionality. The complementary polarity may be appropriate for a network external to a semiconductor device 500 containing the transconductor 502.

Figure 6:
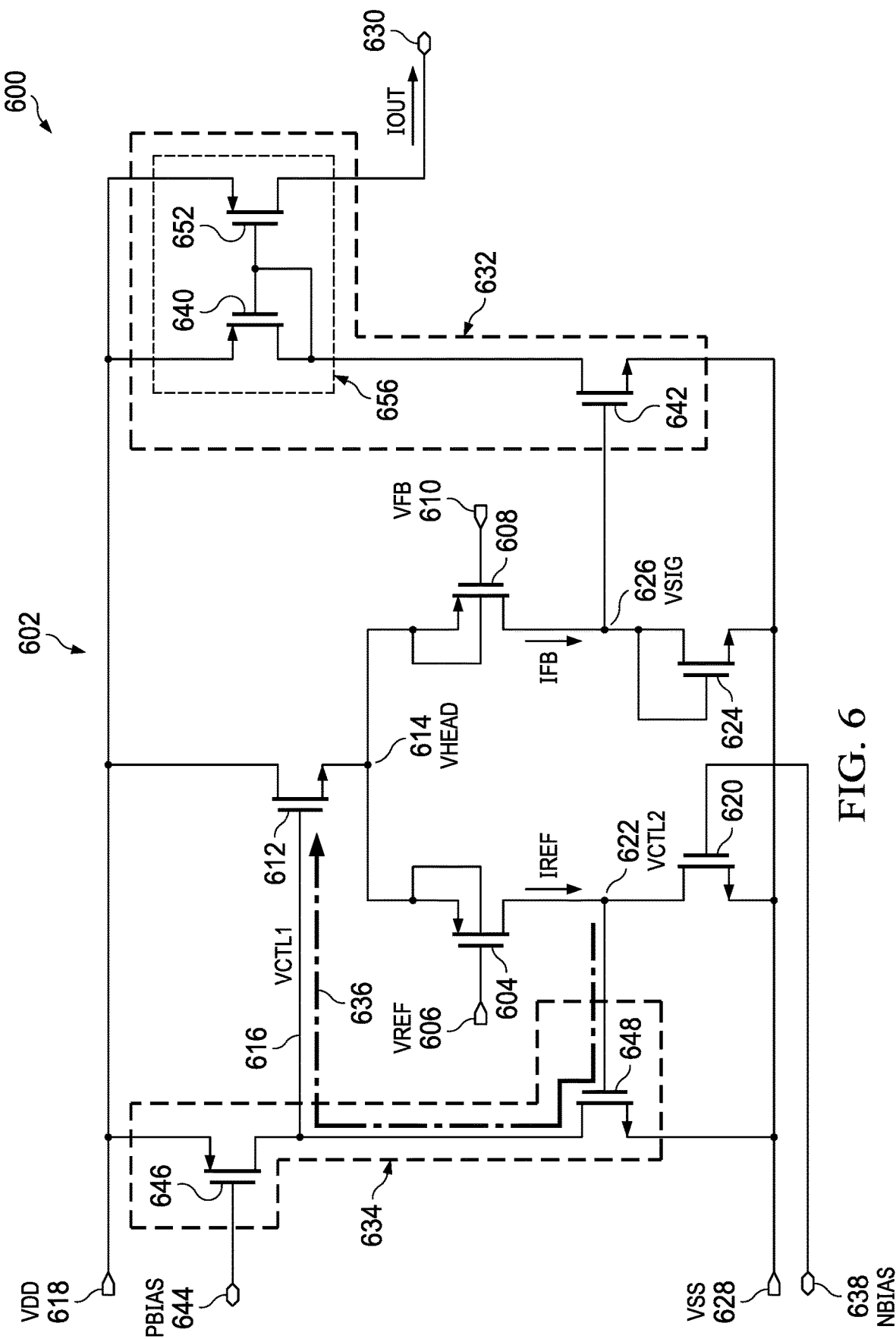
FIG. 6 is a circuit schematic of another example transconductor, according to an embodiment of this description.

FIG. 6 is a circuit schematic of another example transconductor, according to an embodiment of this description. The transconductor 602 includes a reference input stage 604 configured to receive a reference potential, labeled "VREF" in FIG. 6, at a reference input port 606, and a feedback input stage 608 configured to receive a feedback potential, labeled "VFB" in FIG. 6, at a feedback input port 610. In this example, the reference input stage 604 and the feedback input stage 608 may be implemented as PFETs, which have negative transconductances.

The transconductor 602 includes a current limiting component 612 coupled in series with the reference input stage 604 and with the feedback input stage 608, in parallel current paths, as shown in FIG. 6, at a branch node 614. In this example, the current limiting component 612 may be implemented as an NFET, which has a positive transconductance. The current limiting component 612 has a current control node 616, which has a first control potential, labeled "VCTL1" in FIG. 6, during operation of the transconductor 602. The current limiting component 612 is coupled to a power terminal 618 that is configured to provide current at a positive power potential, labeled "VDD" in FIG. 6, to the transconductor 602. The current flows from the power terminal 618 through the current limiting component 612 and divides into a reference current, labeled "IREF" in FIG. 6, through the reference input stage 604, and a feedback current, labeled "IFB" in FIG. 6, through the feedback input stage 608.

The transconductor 602 includes a feedback load 624 connected through an output signal node 626 to the feedback input stage 608. In this example, the feedback load 624 may be implemented as an NMOS diode, in which a gate of the NMOS diode is directly connected to a drain of the NMOS diode, as indicated in FIG. 6. An output signal potential, labeled "VSIG" in FIG. 6, at the output signal node 626 is equal to a voltage drop across the feedback load 624 due to the feedback current IFB.

The transconductor 602 includes a reference load 620 connected through a control signal node 622 to the reference input stage 604. In this example, the reference load 620 may be implemented as an NFET. A gate of the reference load 620 may be connected to an NMOS bias terminal 638. A second control potential, labeled "VCTL2" in FIG. 6, at the control signal node 622 is equal to a voltage drop across the reference load 620 due to the reference current IREF.

The reference load 620 and the feedback load 624 are connected to a ground terminal 628 which is configured to receive current at a ground potential, labeled "VSS" in FIG. 6. The reference current IREF and the feedback current IFB flow to the ground terminal 628.

The control signal node 622 is coupled to the current control node 616 of the current limiting component 612 through an inverting control buffer 634, as indicated in FIG. 6, so that the first control potential VCTL1 has a negative correlation to the second control potential VCTL2. In this example, the inverting control buffer 634 includes a control load 646, implemented as a PFET in this example, and a control driver 648, implemented as an NFET in this example, coupled in series, with the control signal node 622 connected to a drain of the control load 646 and to a drain of the control driver 648. A gate of the control load 646 is connected to a PMOS bias terminal 644. A gate of the control driver 648 is connected to the control signal node 622. A source of the control load 646 is connected to the power terminal 618. A source of the control driver 648 is connected to the ground terminal 628. Coupling the control signal node 622 to the current control node 616 through the inverting control buffer 634 provides a negative feedback path 636 that reduces variations in a head potential, labeled "VHEAD" in FIG. 6, at the branch node 614 when the feedback current IFB changes due to variations in the feedback potential VFB.

The transconductor 602 includes an output current terminal 630 coupled to the output signal node 626 through an output buffer 632. The output buffer 632 converts the output signal potential VSIG at the output signal node 626 to an output current, labeled "IOUT" in FIG. 6, which flows through the output current terminal 630. In this example, the output buffer 632 includes an output driver 642, implemented as an NFET in this example, in series with an output current sensor 640 of an output current mirror 656. The output current mirror 656 includes an output stage 652 connected to the output signal node 626. In this example, the output current sensor 640 and the output stage 652 may be implemented as PFETs. A source of the output driver 642 is connected to the ground terminal 628. A source of the output current sensor 640 and a source of the output stage 652 are connected to the power terminal 618.

Operation of the transconductor 602 proceeds as described for the transconductor 302 of FIG. 3, up to the output buffer 632. The output current mirror 656 provides more current than the output buffer 332 of FIG. 3, and enables the transconductor 602 to operate at a lower value of the positive power potential VDD than the transconductor 302. The output buffer 632 of this example provides a sourced output functionality having a non-complementary polarity for the output current IOUT. The non-complementary polarity may be appropriate for a network external to a semiconductor device 600 containing the transconductor 602.

Figure 7:
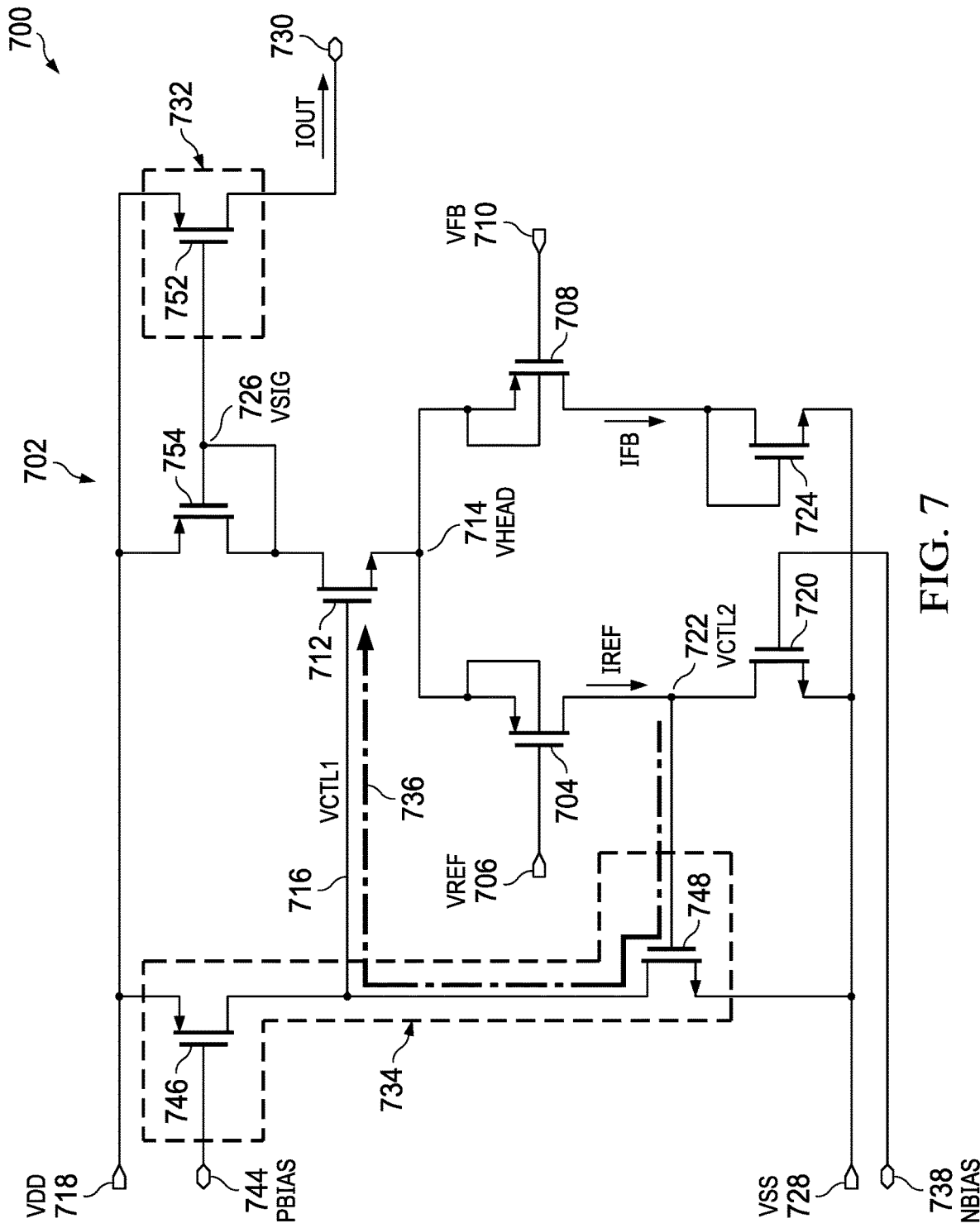
FIG. 7 is a circuit schematic of another example transconductor, according to an embodiment of this description.

FIG. 7 is a circuit schematic of another example transconductor, according to an embodiment of this description. The transconductor 702 includes a reference input stage 704 configured to receive a reference potential, labeled "VREF" in FIG. 7, at a reference input port 706, and a feedback input stage 708 configured to receive a feedback potential, labeled "VFB" in FIG. 7, at a feedback input port 710. In this example, the reference input stage 704 and the feedback input stage 708 may be implemented as PFETs, as indicated in FIG. 7.

The transconductor 702 of this example includes a current sensor 754 coupled in series with a current limiting component 712. In this example, the current sensor 754 is implemented as a PFET, and the current limiting component 712 is implemented as an NFET, as indicated in FIG. 7. A drain of the current sensor 754 is connected to a gate of the current sensor 754 and to a drain of the current limiting component 712. A source of the current sensor 754 connected to a power terminal 718 that is configured to provide current at a positive power potential, labeled "VDD" in FIG. 7, to the transconductor 702. The current sensor 754 of this example is thus configured as a PMOS diode. In this example, the gate of the current sensor 754 provides an output signal node 726, which has an output signal potential, labeled "VSIG" in FIG. 7, during operation of the transconductor 702. The current limiting component 712 has a current control node 716, which has a first control potential, labeled "VCTL1" in FIG. 7, during operation of the transconductor 702. The current limiting component 712 is coupled in series with the reference input stage 704 and with the feedback input stage 708 at a branch node 714.

The transconductor 702 includes a reference load 720, implemented as an NFET in this example, connected through a control signal node 722 to the reference input stage 704. A gate of the reference load 720 may be connected to an NMOS bias terminal 738. A second control potential, labeled "VCTL2" in FIG. 7, at the control signal node 722 is equal to a voltage drop across the reference load 720 due to the reference current IREF.

The transconductor 702 includes a feedback load 724, implemented as an NMOS diode in this example. A drain of the feedback load 724 is connected to the feedback input stage 708. The reference load 720 and the feedback load 724 are connected to a ground terminal 728 which is configured to receive current at a ground potential, labeled "VSS" in FIG. 7.

The current flows from the power terminal 718 through the current sensor 754, through the current limiting component 712 and divides into a reference current, labeled "IREF" in FIG. 7, through the reference input stage 704, and a feedback current, labeled "IFB" in FIG. 7, through the feedback input stage 708. The reference current IREF flows through the control signal node 722 and the reference load 720 to the ground terminal 728. The feedback current IFB flows through the feedback load 724 to the ground terminal 728.

The control signal node 722 is coupled to the current control node 716 of the current limiting component 712 through an inverting control buffer 734, as indicated in FIG. 7, so that the first control potential VCTL1 has a negative correlation to the second control potential VCTL2. In this example, the inverting control buffer 734 includes a control load 746, implemented as a PFET in this example, and a control driver 748, implemented as an NFET in this example, coupled in series, with the control signal node 722 connected to a drain of the control load 746 and to a drain of the control driver 748. A gate of the control load 746 is connected to the PMOS bias terminal 744. A gate of the control driver 748 is connected to the control signal node 722. A source of the control load 746 is connected to the power terminal 718. A source of the control driver 748 is connected to the ground terminal 728. Coupling the control signal node 722 to the current control node 716 through the inverting control buffer 734 provides a negative feedback path 736 that reduces variations in a head potential, labeled "VHEAD" in FIG. 7, at the branch node 714 when the feedback current IFB changes due to variations in the feedback potential VFB.

The transconductor 702 includes an output current terminal 730 coupled to the output signal node 726 through an output buffer 732. The output buffer 732 converts the output signal potential VSIG at the output signal node 726 to an output current, labeled "IOUT" in FIG. 7, which flows through the output current terminal 730. In this example, the output buffer 732 includes an output stage 752, implemented as a PMOS source follower in this example. A source of the output stage 752 is connected to the power terminal 718. A gate of the output stage 752 is connected to the output signal node 726. A drain of the output stage 752 is connected to the output current terminal 730. The output buffer 732 of this example provides a sourced output functionality having a non-complementary polarity for the output current IOUT. Operation of the transconductor 702 is similar to operation of the transconductor 302 of FIG. 3, with the current sensor 754 providing the output signal potential VSIG to enable the sourced output functionality. The output stage 752 may advantageously provide more current than a driver/load buffer, and take up less area in a semiconductor device 700 containing the transconductor 702.

Figure 8:
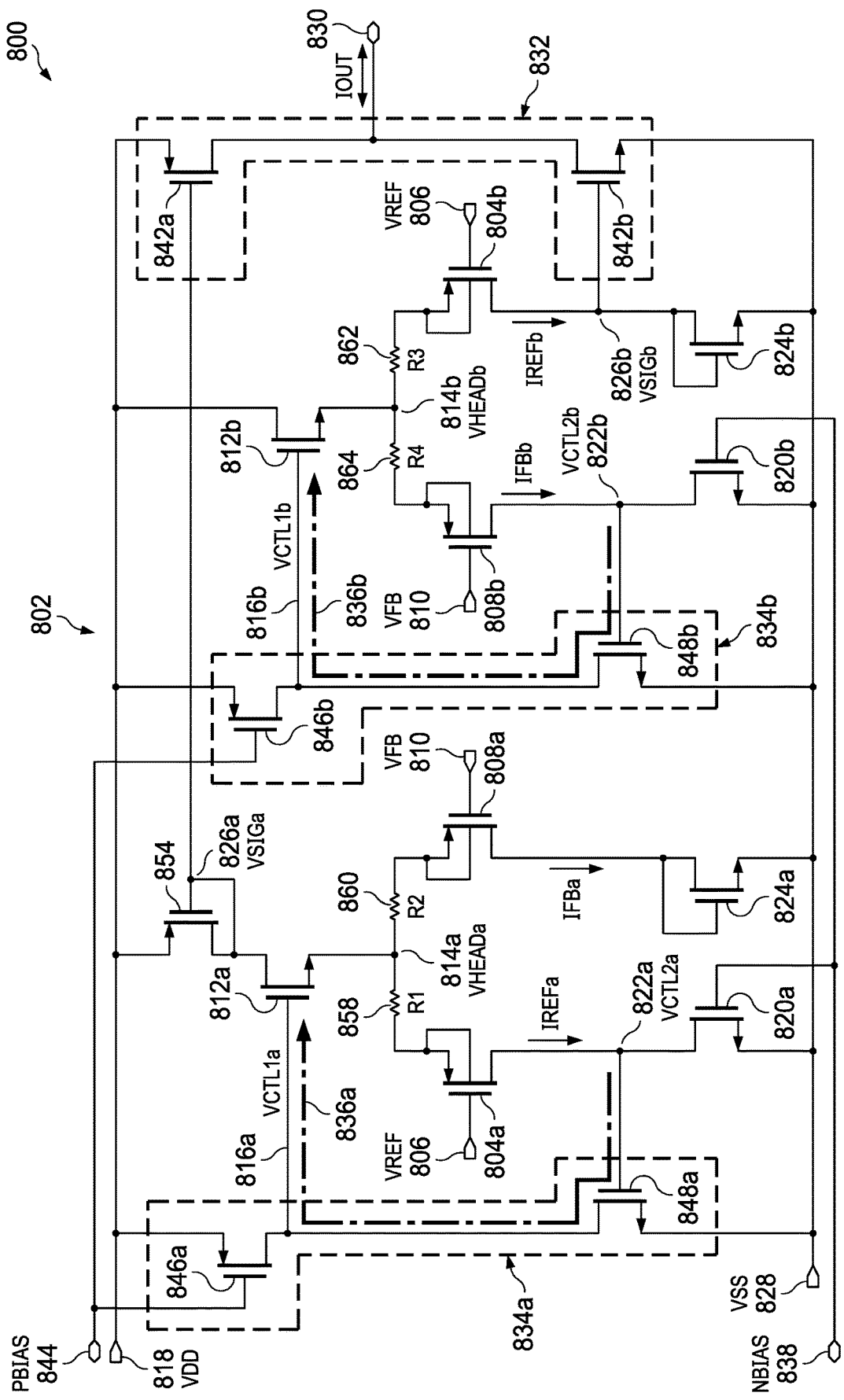
FIG. 8 is a circuit schematic of another example transconductor, according to an embodiment of this description.

FIG. 8 is a circuit schematic of another example transconductor, according to an embodiment of this description. The transconductor 802 includes a first reference input stage 804a configured to receive a reference potential, labeled "VREF" in FIG. 8, at a reference input port 806, paired with a first feedback input stage 808a configured to receive a feedback potential, labeled "VFB" in FIG. 8, at a feedback input port 810. In this example, the first reference input stage 804a and the first feedback input stage 808a may be implemented as PFETs, as indicated in FIG. 8.

The transconductor 802 includes a first current limiting component 812a, implemented as an NFET in this example, as indicated in FIG. 8. A source of the first current limiting component 812a is connected to a first branch node 814a. The first current limiting component 812a has a first current control node 816a, which has a first control potential, labeled "VCTL1a" in FIG. 8, during operation of the transconductor 802. The transconductor 802 of this example includes a current sensor 854 coupled in series with the first current limiting component 812a. In this example, the current sensor 854 is implemented as a PFET. A drain of the current sensor 854 is connected to a gate of the current sensor 854 and to a drain of the first current limiting component 812a. A source of the current sensor 854 connected to a power terminal 818 that is configured to provide current at a positive power potential, labeled "VDD" in FIG. 8, to the transconductor 802. The current sensor 854 of this example is thus configured as a PMOS diode. In this example, the gate of the current sensor 854 provides a first output signal node 826a, which has a first output signal potential, labeled "VSIGa" in FIG. 8, during operation of the transconductor 802.

In this example, the first reference input stage 804a is connected to the first current limiting component 812a through a first resistor 858, labeled "R1" in FIG. 8. The first feedback input stage 808a is connected to the first current limiting component 812a through a second resistor 860, labeled "R2" in FIG. 8.

The transconductor 802 includes a first reference load 820a, implemented as an NFET in this example, connected through a first control signal node 822a to the first reference input stage 804a. A gate of the first reference load 820a may be connected to an NMOS bias terminal 838.

The transconductor 802 includes a first feedback load 824a, implemented as an NMOS diode in this example. A drain of the first feedback load 824a is connected to the first feedback input stage 808a. A gate of the first feedback load 824a may be connected to the drain of the first feedback load 824a, so that the first feedback load 824a is implemented as an NMOS diode in this example. Sources of the first reference load 820a and the first feedback load 824a are connected to a ground terminal 828 which is configured to receive current at a ground potential, labeled "VSS" in FIG. 8.

The current flows from the power terminal 818 through the current sensor 854, through the first current limiting component 812a and divides into a first reference current, labeled "IREFa" in FIG. 8, through the first resistor R1 858 and through the first reference input stage 804a, and a first feedback current, labeled "IFBa" in FIG. 8, through the second resistor R2 860 and through the first feedback input stage 808a. The reference current IREFa flows through the first control signal node 822a and the first reference load 820a to the ground terminal 828. A second control potential, labeled "VCTL2a" in FIG. 8, at the first control signal node 822*a* is equal to a voltage drop across the first reference load 820*a* due to the reference current IREFa. The feedback current IFBa flows through the first feedback load 824*a* to the ground terminal 828.

The first control signal node 822*a* is coupled to the first current control node 816*a* of the first current limiting component 812*a* through a first inverting control buffer 834*a*, as indicated in FIG. 8, so that the first control potential VCTL1 a has a negative correlation to the second control potential VCTL2a. In this example, the first inverting control buffer 834*a* includes a first control load 846*a*, implemented as a PFET in this example, and a first control driver 848*a*, implemented as an NFET in this example, coupled in series, with the first control signal node 822*a* connected to a drain of the first control load 846*a* and to a drain of the first control driver 848*a*. A gate of the first control load 846*a* is connected to the PMOS bias terminal 844. A gate of the first control driver 848*a* is connected to the first control signal node 822*a*. A source of the first control load 846*a* is connected to the power terminal 818. A source of the first control driver 848*a* is connected to the ground terminal 828. Coupling the first control signal node 822*a* to the first current control node 816*a* through the first inverting control buffer 834*a* provides a first negative feedback path 836*a* that reduces variations in a first head potential, labeled "VHEADa" in FIG. 8, at the first branch node 814*a* when the first feedback current IFBa changes due to variations in the feedback potential VFB.

The transconductor 802 of this example includes a second reference input stage 804*b* configured to receive the reference potential VREF from the reference input port 806, paired with a second feedback input stage 808*b* configured to receive the feedback potential VFB from the feedback input port 810. The second reference input stage 804*b* is connected to a second branch node 814*b* through a third resistor 862, labeled "R3" in FIG. 8. The second feedback input stage 808*b* is connected to the second branch node 814*b* through a fourth resistor 864, labeled "R4" in FIG. 8.

The transconductor 802 includes a second current limiting component 812*b* coupled in series with the second reference input stage 804*b* and with the second feedback input stage 808*b*, in parallel current paths, through the third resistor R3 862 and the fourth resistor R4 864, respectively, as shown in FIG. 8, at the second branch node 814*b*. In this example, the second current limiting component 812*b* may be implemented as an NFET, which has a positive transconductance. The second current limiting component 812*b* has a second current control node 816*b*, which has a third control potential, labeled "VCTL1b" in FIG. 8, during operation of the transconductor 802. The second current limiting component 812*b* is coupled to the power terminal 818. The current flows from the power terminal 818 through the second current limiting component 812*b* and divides into a second reference current, labeled "IREFb" in FIG. 8, through the second reference input stage 804*b*, and a second feedback current, labeled "IFBb" in FIG. 8, through the second feedback input stage 808*b*.

The transconductor 802 includes a second feedback load 824*b* connected through a second output signal node 826*b* to the second feedback input stage 808*b*. In this example, the second feedback load 824*b* may be implemented as an NMOS diode, as indicated in FIG. 8. A second output signal potential, labeled "VSIGb" in FIG. 8, at the second output signal node 826*b* is equal to a voltage drop across the second feedback load 824*b* due to the second feedback current IFBb.

The transconductor 802 includes a second reference load 820*b* connected through a second control signal node 822*b* to the second reference input stage 804*b*. In this example, the second reference load 820*b* may be implemented as an NFET. A gate of the second reference load 820*b* may be connected to the NMOS bias terminal 838. A fourth control potential, labeled "VCTL2b" in FIG. 8, at the second control signal node 822*b* is equal to a voltage drop across the second reference load 820*b* due to the second reference current IREFb.

Sources of the second reference load 820*b* and the second feedback load 824*b* are connected to the ground terminal 828. The second reference current IREFb and the second feedback current IFBb flow to the ground terminal 828.

The second control signal node 822*b* is coupled to the second current control node 816*b* of the second current limiting component 812*b* through a second inverting control buffer 834*b*, as indicated in FIG. 8, so that the third control potential VCTL1b has a negative correlation to the fourth control potential VCTL2b. In this example, the second inverting control buffer 834*b* includes a second control load 846*b*, implemented as a PFET in this example, and a second control driver 848*b*, implemented as an NFET in this example, coupled in series, with the second control signal node 822*b* connected to a drain of the second control load 846*b* and to a drain of the second control driver 848*b*. A gate of the second control load 846*b* is connected to the PMOS bias terminal 844. A gate of the second control driver 848*b* is connected to the second control signal node 822*b*. A source of the second control load 846*b* is connected to the power terminal 818. A source of the second control driver 848*b* is connected to the ground terminal 828. Coupling the second control signal node 822*b* to the second current control node 816*b* through the second inverting control buffer 834*b* provides a second negative feedback path 836*b* that reduces variations in a second head potential, labeled "VHEADb" in FIG. 8, at the second branch node 814*b* when the second feedback current IFBb changes due to variations in the feedback potential VFB.

The transconductor 802 includes an output current terminal 830 coupled to the first output signal node 826*a* and the second output signal node 826*b* through an output buffer 832. The output buffer 832 converts the first output signal potential VSIGa at the first output signal node 826*a* and the second output signal potential VSIGb at the second output signal node 826*b* to an output current, labeled "IOUT" in FIG. 3, which flows through the output current terminal 830. In this example, the output buffer 832 includes a first output driver 842*a*, implemented as a PFET in this example, and a second output driver 842*b*, implemented as an NFET in this example, coupled in series, drain to drain. A source of the first output driver 842*a* is connected to the power terminal 818; a source of the second output driver 842*b* is connected to the ground terminal 828. The first output signal node 826*a* is connected to a gate of the first output driver 842*a*, and the second output signal node 826*b* is connected to a gate of the second output driver 842*b*. The output current terminal 830 is connected to the drain of the first output driver 842*a* and to the drain of the second output driver 842*b*. The output buffer 832 of this example provides a bidirectional output functionality having a non-complementary polarity for the output current IOUT. The resistors R1 858, R2 860, R3 862, and R4 864 may advantageously provide more linearity in the output current IOUT as a function of a difference between the feedback potential VFB and the reference potential VREF. The bidirectional output functionality may be appropriate for a network external to a semiconductor device 800 containing the transconductor 802.

Figure 9:
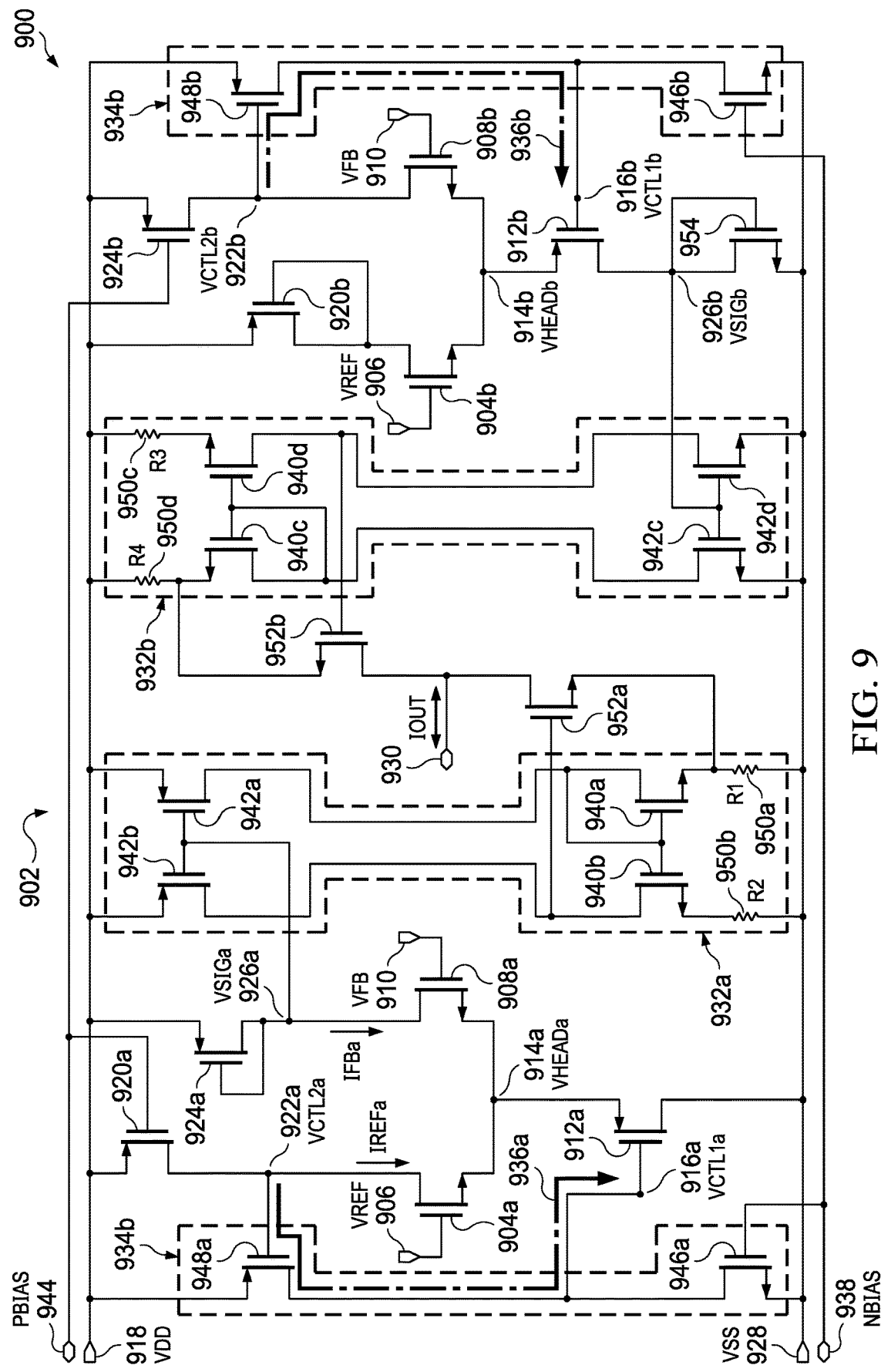
FIG. 9 is a circuit schematic of another example transconductor, according to an embodiment of this description.

FIG. 9 is a circuit schematic of another example transconductor, according to an embodiment of this description. The transconductor 902 includes a first reference input stage 904a configured to receive a reference potential, labeled "VREF" in FIG. 9, at a reference input port 906, paired with a first feedback input stage 908a configured to receive a feedback potential, labeled "VFB" in FIG. 9, at a feedback input port 910. In this example, the first reference input stage 904a and the first feedback input stage 908a may be implemented as NFETs, as indicated in FIG. 9. During operation of the transconductor 902, a first reference current, labeled "IREFa" in FIG. 9, flows through the first reference input stage 904a, and a first feedback current, labeled "IFBa" in FIG. 9, through the first feedback input stage 908a.

The transconductor 902 includes a first current limiting component 912a coupled in series with the first reference input stage 904a and with the first feedback input stage 908a, in parallel current paths, as shown in FIG. 9, at a first branch node 914a. In this example, the first current limiting component 912a may be implemented as a PFET, which has a negative transconductance. The first current limiting component 912a has a first current control node 916a, which has a first control potential, labeled "VCTL1a" in FIG. 9, during operation of the transconductor 902. A drain of the first current limiting component 912a is coupled to a ground terminal 928 which is configured to receive current at a ground potential, labeled "VSS" in FIG. 9. The first reference current IREFa and the first feedback current IFBa combine at the first branch node 914a and flow through the first current limiting component 912a to the ground terminal 928.

The transconductor 902 includes a first reference load 920a, implemented as a PFET in this example, connected through a first control signal node 922a to the first reference input stage 904a. A gate of the first reference load 920a may be connected to a PMOS bias terminal 944.

The transconductor 902 includes a first feedback load 924a, implemented as a PMOS diode in this example. A drain of the first feedback load 924a is connected to the first feedback input stage 908a. A gate of the first feedback load 924a may be connected to the drain of the first feedback load 924a, so that the first feedback load 924a is implemented as a PMOS diode in this example. Sources of the first reference load 920a and the first feedback load 924a are connected to a power terminal 918 that is configured to provide current at a positive power potential, labeled "VDD" in FIG. 9, to the transconductor 902.

The current flows from the ground terminal 928 through the first current limiting component 912a and divides into the first reference current IREFa and the first feedback current IFBa at the first branch node 914a. The reference current IREFa flows through the first control signal node 922a and the first reference load 920a to the power terminal 918. A second control potential, labeled "VCTL2a" in FIG. 9, at the first control signal node 922a is equal to a voltage drop across the first reference load 920a with respect to VDD, due to the reference current IREFa. The feedback current IFBa flows through the first feedback load 924a to the power terminal 918.

The first control signal node 922a is coupled to the first current control node 916a of the first current limiting component 912a through a first inverting control buffer 934a, as indicated in FIG. 9, so that the first control potential VCTL1a has a negative correlation to the second control potential VCTL2a. In this example, the first inverting control buffer 934a includes a first control load 946a, implemented as an NFET in this example, and a first control driver 948a, implemented as a PFET in this example, coupled in series, drain to drain, with the first current control node 916a connected to a drain of the first control load 946a and to a drain of the first control driver 948a. A gate of the first control load 946a is connected to an NMOS bias terminal 938. A gate of the first control driver 948a is connected to the first control signal node 922a. A source of the first control load 946a is connected to the ground terminal 928. A source of the first control driver 948a is connected to the power terminal 918. Coupling the first control signal node 922a to the first current control node 916a through the first inverting control buffer 934a provides a first negative feedback path 936a that reduces variations in a first head potential, labeled "VHEADa" in FIG. 9, at the first branch node 914a when the first feedback current IFBa changes due to variations in the feedback potential VFB.

The transconductor 902 of this example includes a second reference input stage 904b configured to receive the reference potential VREF from the reference input port 906, paired with a second feedback input stage 908b configured to receive the feedback potential VFB from the feedback input port 910. The second reference input stage 904b and the second feedback input stage 908b are connected to a second branch node 914b. The transconductor 902 includes a second current limiting component 912b coupled in series with the second reference input stage 904b and with the second feedback input stage 908b, at the second branch node 914b. In this example, the second current limiting component 912b may be implemented as a PFET. The second current limiting component 912b has a second current control node 916b, which has a third control potential, labeled "VCTL1b" in FIG. 9, during operation of the transconductor 902.

The transconductor 902 of this example includes a current sensor 954 coupled in series with the first current limiting component 912a. In this example, the current sensor 954 is implemented as an NFET. A drain of the current sensor 954 is connected to a gate of the current sensor 954 and to a drain of the first current limiting component 912a. A source of the current sensor 954 connected to the ground terminal 928. The current sensor 954 of this example is thus configured as an NMOS diode. In this example, the gate of the current sensor 954 provides a second output signal node 926b, which has a second output signal potential, labeled "VSIGb" in FIG. 9, during operation of the transconductor 902. Also during operation of the transconductor 902, the second reference current IREFb and the second feedback current IFBb combine at the second branch node 914b, and flow through the first current limiting component 912a and the current sensor 954 to the ground terminal 928.

The transconductor 902 includes a second feedback load 924b connected through a second control signal node 922b to the second feedback input stage 908b. In this example, the second feedback load 924b may be implemented as an PFET. A source of the second feedback load 924b may be connected to the power terminal 918. A gate of the second feedback load 924b may be connected to the PMOS bias terminal 944. A fourth control potential, labeled "VCTL2b" in FIG. 9, at the second control signal node 922b is equal to a voltage drop across the second feedback load 924b with respect to VDD, due to the second reference current IREFb.

The transconductor 902 includes a second reference load 920b connected to the second reference input stage 904b. In this example, the second reference load 920b may be implemented as a PMOS diode. Sources of the second reference load 920b and the second feedback load 924b are connected to the power terminal 918.

The second control signal node 922b is coupled to the second current control node 916b of the second current limiting component 912b through a second inverting control buffer 934b, as indicated in FIG. 9, so that the third control potential VCTL1b has a negative correlation to the fourth control potential VCTL2b. In this example, the second inverting control buffer 934b includes a second control load 946b, implemented as an NFET in this example, and a second control driver 948b, implemented as a PFET in this example, coupled in series, with the second current control node 916b connected to a drain of the second control load 946b and to a drain of the second control driver 948b. A gate of the second control load 946b is connected to the NMOS bias terminal 938. A gate of the second control driver 948b is connected to the second control signal node 922b. A source of the second control load 946b is connected to the ground terminal 928. A source of the second control driver 948b is connected to the power terminal 918. Coupling the second control signal node 922b to the second current control node 916b through the second inverting control buffer 934b provides a second negative feedback path 936b that reduces variations in a second head potential, labeled "VHEADb" in FIG. 9, at the second branch node 914b when the second feedback current IFBb changes due to variations in the feedback potential VFB.

The transconductor 902 includes an output current terminal 930 coupled to a first output signal node 926a through a first output buffer 932a and coupled to the second output signal node 926b through a second output buffer 932b. The first output buffer 932a and the second output buffer 932b of this example are inverted configurations of each other.

The first output buffer 932a converts the first output signal potential VSIGa at the first output signal node 926a to a sourced output current portion, which flows through an output current terminal 930. In this example, the first output buffer 932a includes two parallel current paths to provide an amplified transconductance. A first current path of the first output buffer 932a includes a first resistor 950a, labeled "R1" in FIG. 9, a first output load 940a, implemented as an NFET in this example, and a first output driver 942a, implemented as a PFET in this example, coupled in series. A first terminal of the first resistor 950a is connected to the ground terminal 928. A source of the first output load 940a is connected to a second terminal of the first resistor 950a. A source of the first output driver 942a is connected to the power terminal 918. A second current path of the first output buffer 932a includes a second resistor 950b, labeled "R2" in FIG. 9, a second output load 940b, implemented as an NFET in this example, and a second output driver 942b, implemented as a PFET in this example, coupled in series. A first terminal of the second resistor 950b is connected to the ground terminal 928. A source of the second output load 940b is connected to a second terminal of the second resistor 950b. A source of the second output driver 942b is connected to the power terminal 918. Gates of the first output load 940a and the second output load 940b are connected to a drain of the first output load 940a; the first output load 940a thus operates as an NMOS diode. Gates of the first output driver 942a and the second output driver 942b are connected to the first output signal node 926a. The first output buffer 932a includes a first output stage 952a, implemented as an NFET in this example. A source of the first output stage 952a is connected to the source of the first output load 940a. A gate of the first output stage 952a is connected to a drain of the second output driver 942b. A drain of the first output stage 952a is connected to the output current terminal 930. The first output buffer 932a amplifies the first output signal potential VSIGa at the first output signal node 926a by a factor approximately equal to a ratio of a resistance of the second resistor 950b to a resistance of the first resistor 950a.

The second output buffer 932b converts the second output signal potential VSIGb at the second output signal node 926b to a sunk output current portion, which flows through the output current terminal 930. In this example, the second output buffer 932b includes two parallel current paths to provide an amplified transconductance. A first current path of the second output buffer 932b includes a third resistor 950c, labeled "R3" in FIG. 9, a third output load 940c, implemented as an PFET in this example, and a third output driver 942c, implemented as an NFET in this example, coupled in series. A first terminal of the third resistor 950c is connected to the power terminal 918. A source of the third output load 940c is connected to a second terminal of the third resistor 950c. A source of the third output driver 942c is connected to the ground terminal 928. A second current path of the second output buffer 932b includes a fourth resistor 950d, labeled "R4" in FIG. 9, a fourth output load 940d, implemented as a PFET in this example, and a fourth output driver 942d, implemented as an NFET in this example, coupled in series. A first terminal of the fourth resistor 950d is connected to the power terminal 918. A source of the fourth output load 940d is connected to a second terminal of the fourth resistor 950d. A source of the fourth output driver 942d is connected to the ground terminal 928. Gates of the third output load 940c and the fourth output load 940d are connected to a drain of the third output load 940c; the third output load 940c thus operates as a PMOS diode. Gates of the third output driver 942c and the fourth output driver 942d are connected to the second output signal node 926b. The second output buffer 932b includes a second output stage 952b, implemented as a PFET in this example. A source of the second output stage 952b is connected to the source of the third output load 940c. A gate of the second output stage 952b is connected to a drain of the fourth output driver 942d. A drain of the second output stage 952b is connected to the output current terminal 930. The second output buffer 932b amplifies the second output signal potential VSIGb at the second output signal node 926b by a factor approximately equal to a ratio of a resistance of the fourth resistor 950d to a resistance of the third resistor 950c. The first output buffer 932a and the second output buffer 932b of this example provide a bidirectional output functionality having a complementary polarity for the output current IOUT. The bidirectional output functionality and complementary polarity may be appropriate for a network external to a semiconductor device 900 containing the transconductor 902.

Modifications are possible in the described embodiments, and other embodiments are possible, within the scope of the claims.

What is claimed is:

1. A semiconductor device including a transconductor, comprising:
  a reference input stage configured to receive a reference potential;
  a feedback input stage configured to receive a feedback potential;
  a current limiting component configured to control a total current through the reference input stage and the feedback input stage, wherein the current limiting component includes a control terminal, a first current terminal, and a second current terminal;
a reference load coupled in series with the reference input stage, wherein:
the reference input stage includes a first transistor having a first current terminal, a second current terminal, and a control terminal;
the reference load includes a second transistor having a first current terminal, a second current terminal, and a control terminal;
the control terminal of the reference load is configured to be coupled to an external bias;
the first current terminal of the first transistor is coupled to the first current terminal of the second transistor; and
the second current terminal of the first transistor is coupled to the second current terminal of the current limiting component;
a feedback load coupled in series with the feedback input stage, wherein:
the feedback load includes a third transistor having a first current terminal, a second current terminal, and a control terminal;
the control terminal of the third transistor is coupled to the first current terminal of the third transistor;
the first current terminal of the third transistor is coupled to the feedback input stage; and
the second current terminal of the third transistor is coupled to the second current terminal of the second transistor;
an output current terminal coupled to the feedback load through a non-inverting output buffer, configured to provide an output current that is a function of a difference between the reference potential and the feedback potential; and
a negative feedback loop including a first terminal and a second terminal, wherein the first terminal is coupled to the first current terminal of the first transistor and the first current terminal of the second transistor, and wherein the second terminal is coupled to the control terminal of the current limiting component, the negative feedback loop configured to compensate for a change in the total current due to a difference between the reference potential and the feedback potential, the difference between the reference potential and the feedback potential being the reference potential minus the feedback potential.

2. The semiconductor device of claim 1, wherein a transconductance of the transconductor increases as an absolute value of the difference between the reference potential and the feedback potential increases.

3. The semiconductor device of claim 1, wherein the transconductor is configured to provide the output current with a sunk output functionality, wherein the output current is controlled by controlling an output driver connected between the output current terminal and a ground terminal of the semiconductor device.

4. The semiconductor device of claim 1, wherein the transconductor is configured to provide the output current with a sourced output functionality, wherein the output current is controlled by controlling an output driver connected between the output current terminal and a power terminal of the semiconductor device.

5. The semiconductor device of claim 1, wherein the transconductor is configured to provide the output current with a bidirectional output functionality, wherein the output current is controlled by controlling an output driver connected between the output current terminal and a power terminal of the semiconductor device, and by controlling another output driver connected between the output current terminal and a ground terminal of the semiconductor device.

6. The semiconductor device of claim 1, wherein the transconductor is configured to provide a complementary polarity of the output current, so the output current decreases when the difference between the reference potential and the feedback potential increases, and increases when the difference between the reference potential and the feedback potential decreases.

7. The semiconductor device of claim 1, wherein the transconductor is configured to provide a non-complementary polarity of the output current, so the output current increases when the difference between the reference potential and the feedback potential increases, and decreases when the difference between the reference potential and the feedback potential decreases.

8. The semiconductor device of claim 1, wherein the current limiting component includes an n-channel field effect transistor (NFET).

9. The semiconductor device of claim 1, wherein the current limiting component includes a p-channel field effect transistor (PFET).

10. The semiconductor device of claim 1, wherein the reference load includes an NFET.

11. The semiconductor device of claim 1, wherein the feedback load includes an NFET.

12. The semiconductor device of claim 1, wherein the negative feedback loop includes an inverting buffer.

13. The semiconductor device of claim 12, wherein the inverting buffer includes a control load coupled in series with a control driver.

14. The semiconductor device of claim 13, wherein the control driver is connected to the reference load and the reference input stage.

15. The semiconductor device of claim 13, wherein the current limiting component is connected to the control load and the control driver.

16. The semiconductor device of claim 13, wherein the control load is implemented as a PFET and the control driver is implemented as an NFET.

17. The semiconductor device of claim 1, further including a current sensor coupled in series with the current limiting component.

18. The semiconductor device of claim 1, further including:
a first resistor coupled in series between the current limiting component and the reference input stage; and
a second resistor coupled in series between the current limiting component and the feedback input stage.

19. The semiconductor device of claim 1, wherein the non-inverting output buffer includes an amplifier configured to provide an amplified transconductance.

20. The semiconductor device of claim 1, wherein:
the reference input stage is a first reference input stage;
the feedback input stage is a first feedback input stage;
the current limiting component is a first current limiting component;
the reference load is a first reference load;
the feedback load is a first feedback load;
the non-inverting output buffer is a first output buffer;
the negative feedback loop is a first negative feedback loop; and
the total current is a first total current;
and further including:

a second reference input stage configured to receive the reference potential;

a second feedback input stage configured to receive the feedback potential;

a second current limiting component configured to control a total current through the second reference input stage and the second feedback input stage;

a second reference load coupled in series with the second reference input stage;

a second feedback load coupled in series with the second feedback input stage;

a second output buffer coupled between the second feedback load and the output current terminal; and a second negative feedback loop from the second reference load to the second current limiting component, configured to compensate for a change in a second total current through the second reference input stage and the second feedback input stage due to the difference between the reference potential and the feedback potential.

* * * * *